Feb. 11, 1964 D. W. POTTER 3,121,198
A.C. SIGNAL POLARIZING CIRCUIT
Filed Aug. 24, 1960
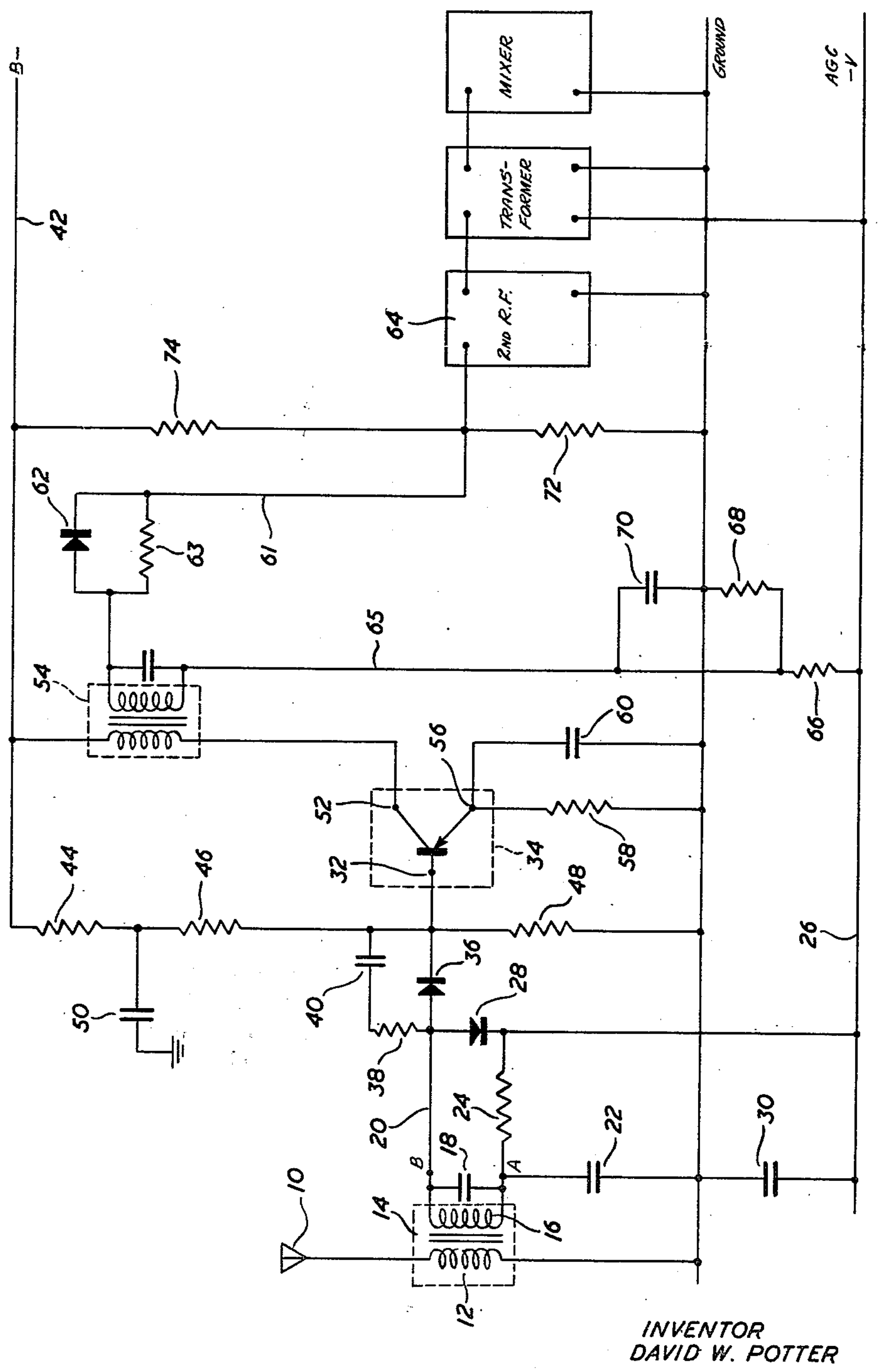
INVENTOR
DAVID W. POTTER
BY R. L. Westell
PATENT AGENT United States Patent Office 3,121,198
Patented Feb. 11, 1964

3,121,198
A.C. SIGNAL POLARIZING CIRCUIT

David W. Potter, Scarborough, Ontario, Canada, assignor to F. V. Topping Electronics Ltd., Leaside, Ontario, Canada Filed Aug. 24, 1960, Ser. No. 51,753
2 Claims. (Cl. 325—319)

This invention relates to circuitry for use in combination with an electronic amplifier and to a protective circuit for use in combination with amplifier circuits. By the term "electronic circuit" I include a transistor circuit. By the term "signal" I refer to a radio frequency "carrier" with "modulation" superimposed thereon. Thus the "carrier" is the radio frequency portion of the signal and the "modulation" is the intelligence superimposed on the "carrier."

By "rectifier" I mean a semi-conductor diode rectifier.

By "reverse-biased" in relation to a rectifier I include not only the state where the voltage drop across the rectifier is in the opposite direction to the conducting direction through the rectifier but also the state where the voltage drop across the rectifier is in the conducting direction but is below the level for substantial conduction through the rectifier.

In many amplifier applications it is desirable to attenuate the amplitude of a signal to be applied to an amplifier stage. This may be done to keep the signal amplitude below values which will cause distortion or breakdown in the particular amplifier stage itself or distortion or breakdown in circuit stages located electrically on the output side of such amplifier stage. Such considerations are particularly important when transistors are used, since relative to vacuum tubes, transistors have a small linear amplification range and breakdown at low applied voltage values.

In communications receiver applications the above considerations apply to the signal for which the receiver is tuned, hereinafter referred to as the "desired signal." Distortion and breakdown may also occur in receivers, due to an undesired signal picked up by the receiver of substantially greater strength than the desired signal. Distortion and breakdown due to the desired signal itself are encountered with mobile receiver equipment, particularly where the desired signal strength can vary over a large range depending on the proximity of the receiver to the transmitter.

It is therefore an object of this invention to provide means for attenuating the signal for an amplifier in an amount varying with the strength of the signal to be applied thereto.

It is an object of this invention to apply such means to a transistor circuit.

It is an object of this invention to provide means for attenuating the signal for an amplifier in a circuit with automatic gain control (hereinafter known as AGC) in an amount varying with the level of the voltage in the AGC circuit.

It is an object of this invention to provide means for protecting the receiver circuit against signals of undue strength received by the antenna, without distorting the modulation of signals so received.

It is an object of this invention to provide means for shifting the level of signals having peaks ranging between predetermined levels and polarities, received by a circuit, into a signal of less than or greater than a predetermined polarity, as desired, but without substantive distortion of the signal modulation. One function of such means is to protect a receiver circuit against signals of undesired polarities received by an antenna.

It is an object of this invention to provide such signal level shifting means in a receiver having AGC wherein said predetermined level is controlled by the AGC level.

It is an object of this invention to provide an amplifier circuit wherein the amplifier input is supplied through a rectifier forming part of an attenuator adapted to receive signals and adapted to pass them in attenuated form to the amplifier but wherein the rectifier is reverse-biased to an amount greater than the input signal range.

It is an object of this invention to provide an amplifier circuit where the input is fed through a reverse-biased rectifier as described above and having AGC and wherein the AGC is connected to vary the reverse-bias of the rectifier.

It is an object of this invention to provide a receiver amplifier circuit wherein the amplifier input is supplied through a rectifier adapted to pass signals in the amplifier direction but wherein the rectifier is reverse-biased to an amount greater than the normal input signal range and wherein the rectifier is also preceded by circuitry adapted to convert the signal received by the antenna into a signal negative relative to the output side of the rectifier by an amount varying with the input signal amplitude.

There is also provided a circuit for protecting a receiver or other circuitry from the effect of over-voltage or voltage surges in the signal or signals received by the circuit.

The protective circuit is of particular value when used with a transistorized receiver circuit or amplifier. In a receiver, the protective circuit is located between the antenna and the remainder of the receiver circuitry.

A signal to which the receiver is tuned will, if stronger than desired, be ultimately reduced by the receiver AGC system, which will effectively reduce the output of the amplifier stages once it has been brought into operation. However, by the time the AGC has taken effect a part of the system may have already been damaged by the strength of the signal.

Damage to the system may also occur from a strong signal of another frequency than that to which the receiver is tuned.

It is an object of this invention to provide a protective circuit, designed to prevent damage to a receiver system from desired signal voltages of higher than design strength or from excessively strong unwanted signals.

It is an object of this invention to provide such a protective circuit electrically located between the antenna and the remainder of the receiver circuit.

It is an object of this invention to provide such a protective circuit, designed to protect against excessive voltages of wanted signals without causing serious distortion and cross modulation of such signals.

It is an object of this invention to provide a circuit designed to transform an input signal into an output signal carrying the modulation on one side having a voltage of only one polarity. In a preferred embodiment of this invention there is provided a circuit wherein the signal for a reverse-biased rectifier is passed through the circuit described in the previous sentence.

As will be seen from the operation of the inventive principles the invention is applicable to any kind of circuit and to frequency, amplitude or phase modulation.

The figure shows a preferred embodiment of the inventive circuitry incorporated in a transistorized receiver circuit, and wherein parts of the receiver circuit not necessary for the explanation of the invention are shown in block form.

The circuit will be described beginning with the input end and hence the protective device will be described before the amplifier control circuitry.

In the drawings is shown an antenna 10 connected to ground through the input winding 12 of the transformer 14. The output winding 16 of the transformer is tuned to the wanted frequency by any desired means such as by the condenser 18 in parallel therewith.

One end of the output winding 16 designated as point B is connected to the input line 20, of the receiver network proper. The other end of the output winding 16 designated as point A is connected through a capacitor 22 to ground. The connection between output winding 16 and capacitor 22 is connected through resistor 24 to the AGC circuit line 26 which is normally negative with respect to ground.

A rectifier 28 is connected between line 20 and the AGC line 26 oriented to pass currents when the point B is positive with respect to the AGC line 26.

A capacitor 30 connects the AGC line 26 to ground and its purpose is to ground radio frequency currents which from time to time appear on the AGC line.

The capacitance-resistance series combination 22—24 is designed to have a time constant long with respect to the period of the desired signal frequency but short with respect to the modulation frequency period.

In operation the AGC line would normally charge capacitor 22 through $R_{24}$ rendering point B at AGC potential with a voltage —V being the AGC voltage from time to time in line 26.

When an alternating signal voltage of peak value S appears across the winding 16, then if the first cycle is positive (i.e. point B positive with respect to point A) then rectifier 28 acts as a conductor preferably but not necessarily of low impedance relative to condenser 22 and the voltage at point B is —V the AGC voltage (excluding the small voltage drop across rectifier 28) while the voltage at point A is substantially —(V plus S). The capacitor 22 is thus charged to a voltage —(V plus S) which gradually leaks to ground through resistor 24 in accord with the relatively slow resistor-capacitor time constant.

It will be understood that peak value S will vary in value in accord with the modulations.

When the alternating signal voltage S reverses polarity, then the charge at point A is slightly more positive than —(V plus S) due to leakage. The voltage at point B is then a little more positive than —(V plus 2S) by the amount of leakage from capacitor 22. It will be noted that in this polarity of the voltage S, the rectifier 28 acts as an open circuit.

When the signal S again reverses to return to its initial stage, voltage at point B rises to the value —V at which point the rectifier 28 becomes a conductor and the voltage at point A again approximates —(V plus S) and so on, as the cycle repeats.

Thus the voltage of point B passed on by the inventive device alternates from —V to —(V plus 2S) the range of the input signal without substantial distortion of the modulation. The point B never becomes substantially more positive than —V the value from time to time of the AGC voltage.

As previously stated, the device is of particular advantage for a transistorized received but it will be obvious that if the input signal across points A and B is received from a source other than an antenna the protective system described above will perform its function.

It will be seen that for correct operation of the device the impedance of rectifier 28 for flow toward line 20 must be of a higher order than the impedance of capacitor 22 and the impedance of capacitor 22 would preferably but not necessarily be of a higher order than the impedance of rectifier 28 for flow through the latter toward AGC line 26.

The output line 20 is connected to the input terminal 32 of an amplifier through rectifier 36. In the preferred embodiment of the invention, the input terminal 32 is the base terminal of a "PNP" type transistor 34, and the rectifier 36 between line 20 and terminal 32 is oriented to pass current in the direction of base 32. In parallel with the rectifier 36 between line 20 and base terminal 32 are resistor 38 and capacitor 40 in series which adjust the range of operation of the device. A negative D.C. supply line 42 is connected to base 32 through resistors 44 and 46 while base 32 is connected to ground through resistor 48. Protection of the negative D.C. supply from the signal is provided by the radio frequency bypass capacitor 50 connecting the line between resistors 44 and 46 to ground. The resistors 44 and 46 on the one hand, and the resistor 48 on the other, set the signal-free negative bias for the transistor base.

The collector terminal 52 of the transistor is connected to the input coil of a coupling transformer 54 while the emitter terminal 56 is connected through resistor 58 and radio frequency bypass capacitor 60 in parallel to ground.

The opposite side of the input coil of transformer 54 is connected to the negative supply line 42.

One terminal of the output coil of the transformer 54 is connected to line 61 through rectifier 62 to the second R.F. stage 64. The rectifiers 62 is oriented to pass current in the direction of the second R.F. stage. In parallel with rectifier 62 is a high value resistor 63 which adjusts the range of operation of the circuit.

The other terminal of the output coil of transformer 54 is connected through line 65 and resistor 66 to the AGC line 26 and the junction of the terminal and resistor 66 is connected to ground through resistor 68 and capacitor 70 in parallel. Resistors 66 and 68 act as voltage dividers to determine the proportion of AGC voltage applied to the output winding of transformer 54.

The operation of the device is as follows: the signal from the antenna on line 20 is, due to the protective device previously explained, a negative signal of amplitude proportional to the signal received by the antenna and ranging as previously explained from a positive limit of substantially —V, being the value of the AGC voltage to a limit —(V plus 2S) less leakage across resistor 24. Thus, as already stated, the mean voltage level of the signal will be —(V plus S) it being understood that S the peak R.F. value will vary with the modulation.

The design of the circuit is such that the output side of rectifier 36 biased from line 42, is, except in one situation, less negative than the value —V being the most positive value of the voltage on line 20 whereby the rectifier 36 is usually reverse-biased, thereby ensuring that no matter how large the input signal becomes, even above the maximum level of the AGC voltage available, its peak cannot forward bias rectifier 36. Such forward biasing, if it occurred, would remove the attenuation of rectifier 36.

For specific functions, however, the system may be designed so that for very weak signals the bias of rectifier 36 is forward so that it acts as a very low resistance.

The normal reverse bias, however, varies with —(V plus S). The rectifier is chosen to have the quality that its impedance (capacitive and/or resistive) varies with the reverse bias. However the signal voltage S has in practice a very small effect and the reverse bias provided by the AGC in fact controls the impedance.

The transistor base terminal 32 therefore is the intermediate point of a voltage divider having on the high impedance side the rectifier 36 and on the low impedance side the resultant impedance to ground of parallel elements comprising: resistance 46 and capacitor 50 in series, resistance 48 and the impedance of transistor 34. The ratio of the voltage drop across biasing resistor 48 (and across the other parallel impedances) to the voltage drop across rectifier 36 will vary as the amplitude of the signal and the signal applied to base terminal 32 may, by the attenuation of rectifier 36, be kept within the required linear range of the transistor so that distortion and breakdown are avoided. The attenuation supplied by rectifier 36 varies substantially as the AGC voltage as explained above.

The output of transistor 34 is applied to the input winding of transformer 54 and the output of the transformer 54 is applied to rectifier 62. The output side of the rectifier 62 is normally biased to a voltage between the negative battery supply line 42 and ground by resistances 74 and 72 in a similar manner to the biasing of the output side of rectifier 36.

The voltage of the input side of the rectifier 62 is a function of the negative AGC voltage divided between resistors 66 and 68 and the output of transistor 52 received through transformer 54. The circuitry is so designed that (except in the case of very weak signals) this input voltage is more negative than the voltage on the output side of the rectifier. Thus the back biasing on rectifier 62 is again a function of the amplitude of the input signal and of the AGC voltage. The input to the second R.F. stage is the modified voltage applied to the input of rectifier 62 divided between the rectifier impedance and the lumped impedance associated with the second R.F. stage being the equivalents, in the second R.F. stage of: resistor 36 and capacitance 50 in series, resistance 48 and the impedance of transistor 34. Thus the signal strength fed to the second R.F. stage varies substantially with the AGC voltage value as explained in relation to the first R.F. stage.

It will be obvious that any amplifier input may be controlled in a similar way, that is, by dividing the input signal voltage between a variably reverse-biased rectifier and an impedance.

In the drawing is shown a transistor amplifier wherein the input is connected to the base 32 and the output is taken from the collector 52. It will be obvious that the principles of the invention will apply if different transistor input and output terminals are used. Thus if a transistor amplifier is used with collector or emitter input it will be seen that the principles of the invention apply. The transistor shown is of the PNP type but if a base input NPN transistor were used then the B— supply would be replaced by a positive supply within the scope of the invention and the AGC voltage would be positive also although less positive than the then positive supply. This change in polarity would also apply if the PNP type of transistor were used with an input requiring positive AGC and D.C. supply.

It will be noted that if the polarities of the AGC and the D.C. supply were reversed, as discussed above, the rectifiers 28 and 36 would also be reversed in direction.

I claim:

1. A device for transposing an A.C. signal having both polarities relative to a D.C. line into a signal having only one polarity relative to a D.C. line, comprising: first and second lines for receiving a signal, said first line having an output terminal and being connected to such D.C. line through a rectifier, means for maintaining said D.C. line at a predetermined voltage with respect to ground independently of the signal on said first and second lines, a resistor connecting said D.C. line and said second line, a capacitor connecting said second line to ground, the time constant of said resistor and said capacitor being longer than the period of signals to be handled by said first and second lines.

2. A protective circuit comprising a device as claimed in claim 1 in combination with an attenuator comprising a second rectifier connected through a second resistor to ground, wherein said output terminal is connected to the terminal of said second rectifier at the terminal thereof remote from said second resistor, and the polarity of said first mentioned rectifier measured from said first line and said output terminal, to said D.C. line is the same as the polarity of said second rectifier measured from said first line and said output terminal to said second resistor.

References Cited in the file of this patent

UNITED STATES PATENTS

| | | |
|---|---|---|
| 2,895,045 | Kagan | July 14, 1959 |
| 2,912,654 | Hansen | Nov. 10, 1959 |
| 2,929,926 | Fibranz | Mar. 22, 1960 |
| 2,937,341 | Aram | May 17, 1960 |
| 2,967,236 | Freedman | Jan. 3, 1961 |

FOREIGN PATENTS

| | | |
|---|---|---|
| 413,383 | Great Britain | July 19, 1934 |